(12) United States Patent
Nagai et al.

(10) Patent No.: US 10,231,339 B2
(45) Date of Patent: Mar. 12, 2019

(54) CIRCUIT BOARD, POWER STORAGE DEVICE, BATTERY PACK, AND ELECTRONIC DEVICE

(71) Applicant: MURATA MANUFACTURING CO., LTD., Kyoto (JP)

(72) Inventors: Takashi Nagai, Fukushima (JP); Hiroyuki Kumagai, Fukushima (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/116,042

(22) PCT Filed: May 13, 2015

(86) PCT No.: PCT/JP2015/002423
§ 371 (c)(1),
(2) Date: Aug. 2, 2016

(87) PCT Pub. No.: WO2015/177988
PCT Pub. Date: Nov. 26, 2015

(65) Prior Publication Data
US 2017/0150605 A1    May 25, 2017

(30) Foreign Application Priority Data

May 22, 2014 (JP) .................................. 2014-105963
Jan. 8, 2015 (JP) .................................. 2015-002590

(51) Int. Cl.
*H05K 1/11* (2006.01)
*H05K 1/18* (2006.01)
(Continued)

(52) U.S. Cl.
CPC ........ *H05K 1/181* (2013.01); *H01M 10/0525* (2013.01); *H01M 10/425* (2013.01);
(Continued)

(58) Field of Classification Search
CPC .................. H05K 1/111; H05K 1/181; H05K 2201/09745; H05K 2201/09909
See application file for complete search history.

(56) References Cited

U.S. PATENT DOCUMENTS 5,656,863 A * 8/1997 Yasunaga .............. H01L 21/565
 257/778
7,557,452 B1 * 7/2009 Williams .......... H01L 23/49811
 257/697
(Continued)

FOREIGN PATENT DOCUMENTS

CN 102281751 12/2011
JP 5889891 5/1983
(Continued)

OTHER PUBLICATIONS

International Search Report issued in international application No. PCT/JP2015/002423, dated Jul. 31, 2015, 2 pages.
(Continued)

*Primary Examiner* — Hoa C Nguyen
(74) *Attorney, Agent, or Firm* — K&L Gates LLP

(57) ABSTRACT

An electronic apparatus is provided including a substrate, a conductive land formed on a surface of the substrate, an electronic component including an electrode, at least one insulating protrusion formed on the land in an overlapping region between the land and the electrode in plan view, and a solder that bonds the electronic component to the land, the solder being formed between the electrode and the land in the overlapping region in a normal direction to the surface of the substrate.

20 Claims, 15 Drawing Sheets

(51) Int. Cl.
*H01M 10/0525* (2010.01)
*H01M 10/42* (2006.01)
*H05K 3/28* (2006.01)
*H05K 3/34* (2006.01)

(52) U.S. Cl.
CPC ............... *H05K 1/111* (2013.01); *H05K 3/34* (2013.01); *H05K 3/3452* (2013.01); *H05K 3/28* (2013.01); *H05K 3/3442* (2013.01); *H05K 2201/099* (2013.01); *H05K 2201/0969* (2013.01); *H05K 2201/09472* (2013.01); *H05K 2201/09663* (2013.01); *H05K 2201/09745* (2013.01); *H05K 2201/09909* (2013.01); *H05K 2203/0588* (2013.01); *Y02P 70/611* (2015.11)

(56) References Cited

U.S. PATENT DOCUMENTS

2004/0134974 A1* 7/2004 Oh ..................... B23K 3/0623
                                                            228/245
2011/0284278 A1   11/2011 Hine et al.
2012/0200366 A1*  8/2012 Nishiyama ............ H03H 9/10
                                                            331/158
2014/0076623 A1*  3/2014 Yamamoto ............ H05K 1/116
                                                            174/264

FOREIGN PATENT DOCUMENTS

| JP | H08-181419 A  | 7/1996  |
| JP | 2003298220    | 10/2003 |
| JP | 2003-318332 A | 11/2003 |
| JP | 2010212318    | 9/2010  |
| JP | 2013-175590 A | 9/2013  |

OTHER PUBLICATIONS

Chinese Office Action dated Jun. 26, 2018 in corresponding Chinese Application No. 201580023310.8.
Japanese Office Action dated Aug. 14, 2018 in corresponding Japanese Application No. 2015-002590.

* cited by examiner

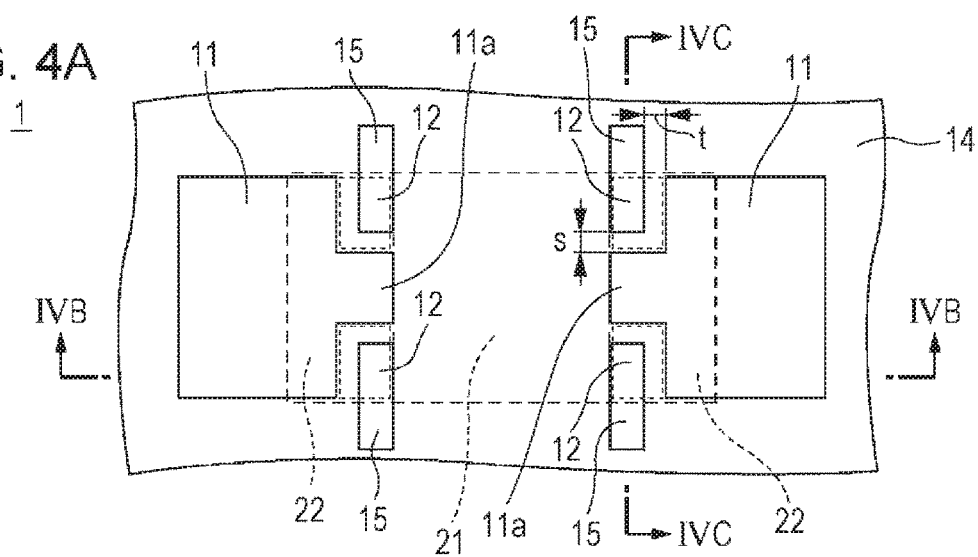
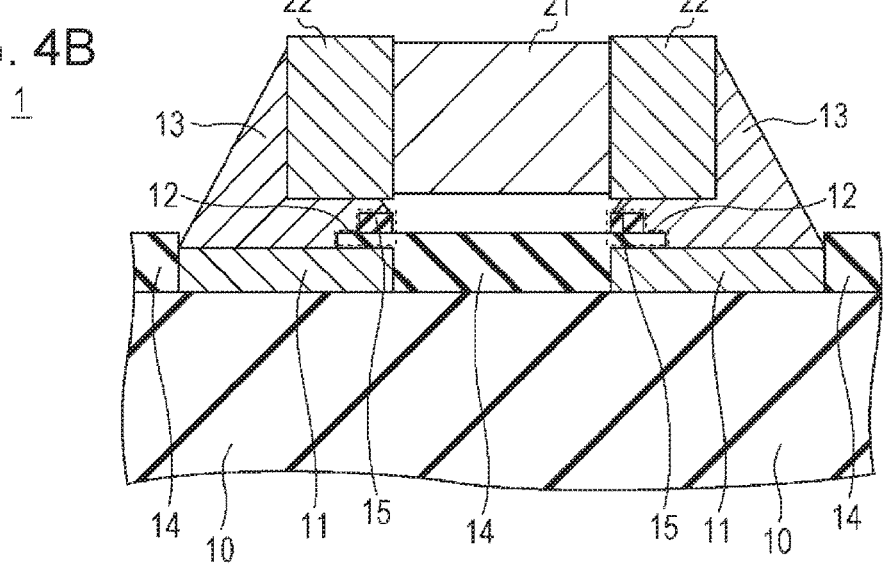
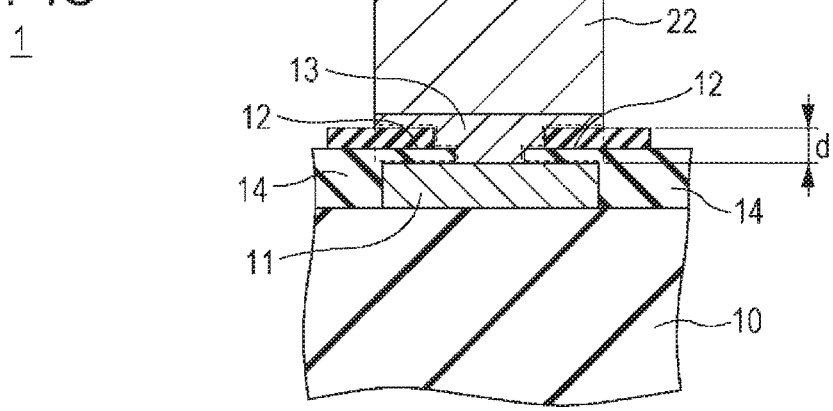

[Fig. 5]
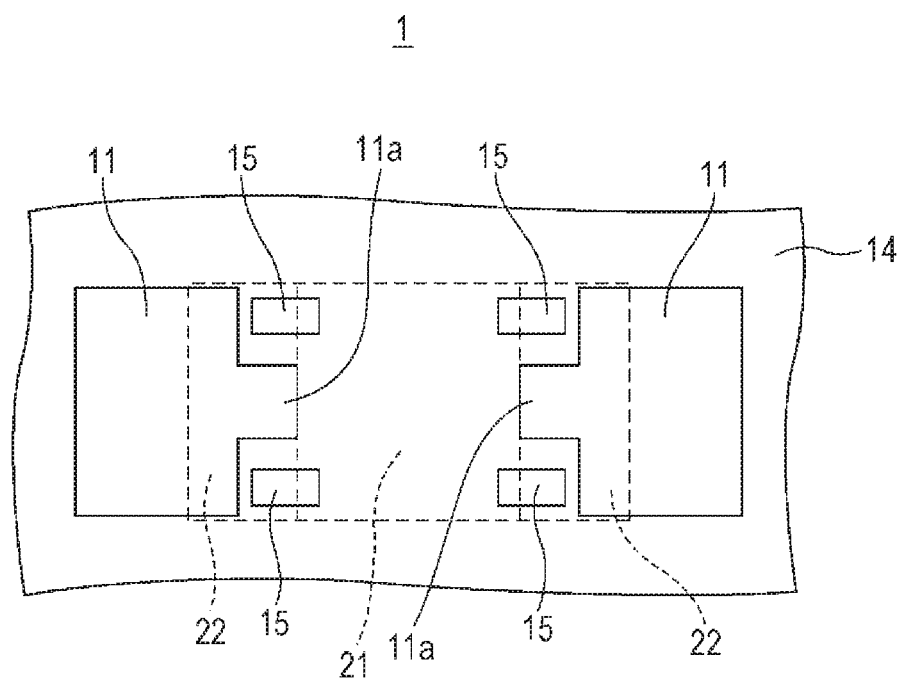

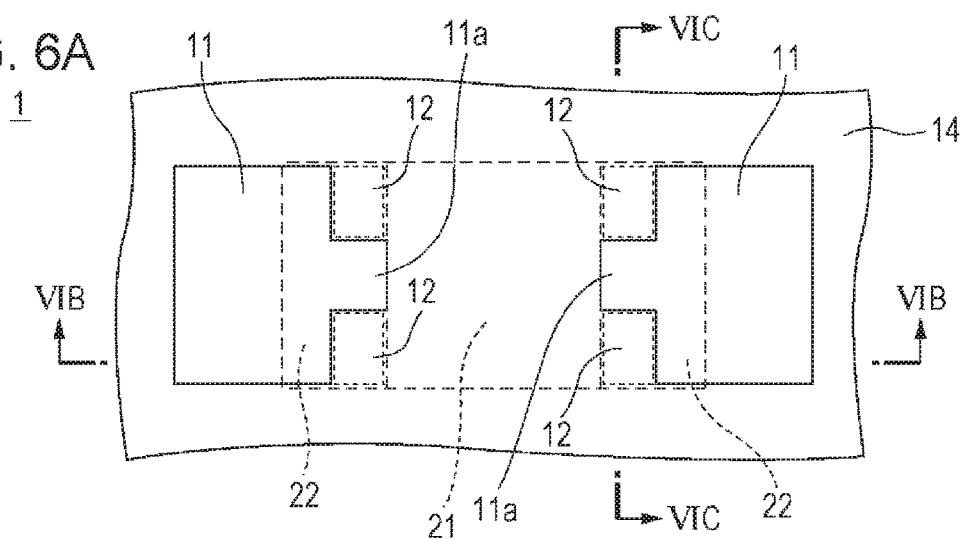
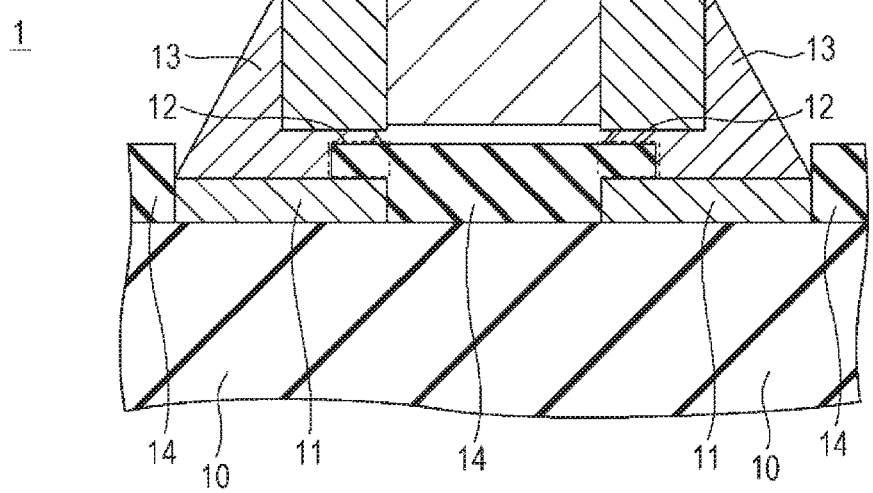
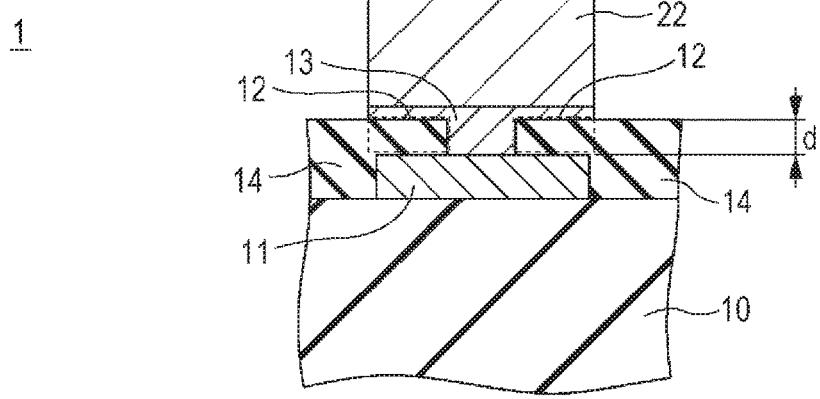

[Fig. 7]
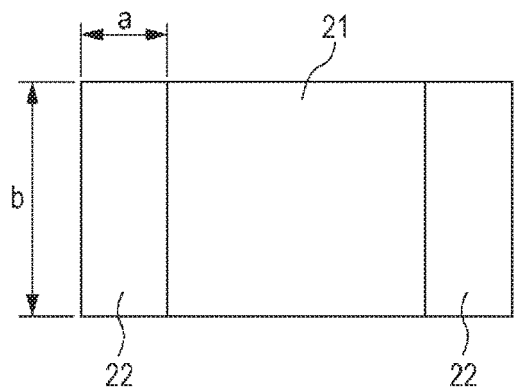

[Fig. 13]
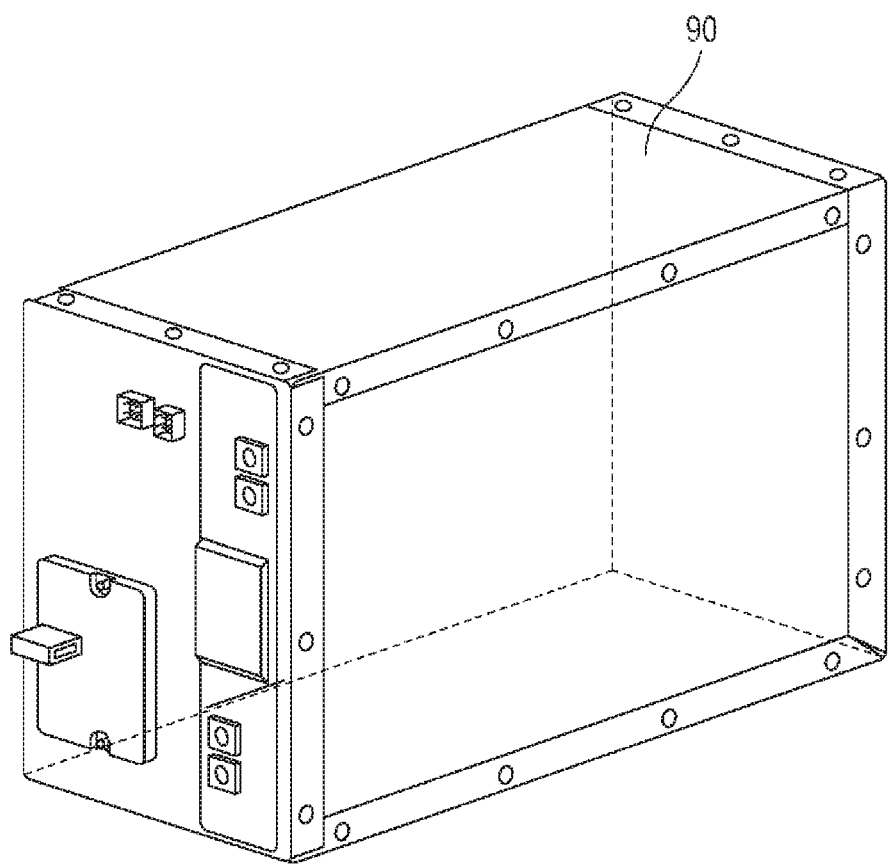

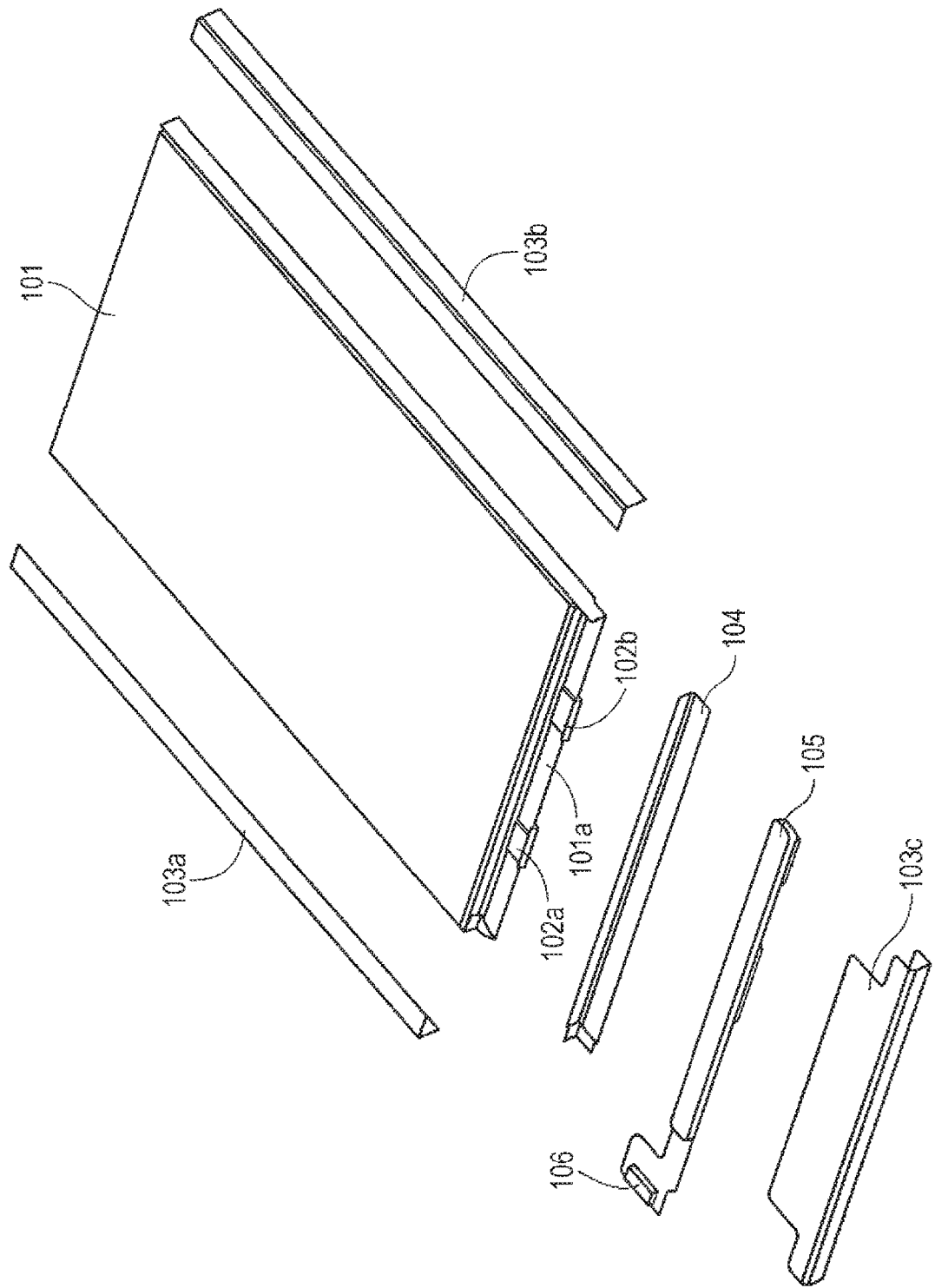
[Fig. 14]

US 10,231,339 B2

CIRCUIT BOARD, POWER STORAGE DEVICE, BATTERY PACK, AND ELECTRONIC DEVICE

CROSS REFERENCE TO RELATED APPLICATIONS

The present application is a national stage of International Application PCT/JP2015/002423, filed May 13, 2015, which claims priority to Japanese Application No. 2014-105963, filed May 22, 2014, and Japanese Application No. 2015-002590, filed Jan. 8, 2015, the entire contents of each of which are hereby incorporated herein by reference.

TECHNICAL FIELD

The present technology relates to a circuit board, a power storage device, a battery pack, and an electronic device.

BACKGROUND ART

A circuit board in which a component such as an integrated circuit or a resistor and a wiring of a conductor such as thin and narrow copper come in close contact with each other on an insulating base material by being bonded through solder bonding is built in an electronic device. Technologies related to the circuit board are described in PTL 1 and PTL 2.

CITATION LIST

Patent Literature

PTL 1: Japanese Unexamined Patent Application Publication No. 2003-318332
PTL 2: Japanese Unexamined Patent Application Publication No. 2013-175590

SUMMARY

Technical Problem

In the circuit board, long-term reliability of the solder bonding has to be improved.

It is desirable to provide a circuit board capable of improving long-term reliability of solder bonding, and a power storage device, a battery pack and an electronic device that include the same.

Solution to Problem

In one embodiment, an electronic apparatus is provided including a substrate, a conductive land formed on a surface of the substrate, an electronic component including an electrode, at least one insulating protrusion formed on the land in an overlapping region between the land and the electrode in plan view, and a solder that bonds the electronic component to the land, the solder being formed between the electrode and the land in the overlapping region in a normal direction to the surface of the substrate.

In another embodiment, an electronic apparatus includes a substrate, a conductive land formed on a surface of the substrate, the land including a cut out portion that exposes a portion of the underlying substrate, an electronic component including an electrode, and a solder that bonds the electronic component to the land. In this embodiment, the solder is formed between the electrode and the substrate in the cut out portion of the land in a normal direction to the surface of the substrate. Also, at least part of the cutout portion is in an overlapping region between the land and the electrode in plan view.

In another embodiment, an electronic apparatus includes a substrate, a conductive land formed on a surface of the substrate, an electrode or a terminal electrically connecting an electronic component, at least one insulating protrusion formed on the land in an overlapping region between the land and the electrode in plan view, and a solder that bonds the electrode or the terminal to the land, the solder being formed therebetween.

In another embodiment, an electronic apparatus includes a substrate, a conductive land formed on a surface of the substrate, the land including a cut out portion or a dent, an electrode or a terminal electrically connecting an electronic component, and a solder that bonds the electronic component to the land, the solder being formed therebetween in the cut out portion or the dent of the land in a normal direction to the surface of the substrate.

Advantageous Effects of Invention

According to the embodiments of the present technology, it is possible to improve long-term reliability of solder bonding.

BRIEF DESCRIPTION OF DRAWINGS

FIG. 4A is a schematic plan view showing the configuration example of a first example of the circuit board according to the first embodiment of the present technology.
FIG. 4B is a schematic cross-sectional view taken along line IVB-IVB of FIG. 4A.
FIG. 4C is a schematic cross-sectional view taken along line IVC-IVC of FIG. 4A.
FIG. 5 is a schematic cross-sectional view showing a modification example of the arrangement of a silk layer.
FIG. 6A is a schematic plan view showing the configuration example of a second example of the circuit board according to the first embodiment of the present technology.
FIG. 6B is a schematic cross-sectional view taken along line VIB-VIB of FIG. 6A.
FIG. 6C is a schematic cross-sectional view taken along line VIC-VIC of FIG. 6A.
FIG. 7 is a schematic diagram showing the list of sizes of a typical electronic component and the list of dimension values of an electrode of each electronic component.

FIG. 13 is a perspective view showing the external appearance of a power storage device.

FIG. 14 is an exploded perspective view showing a configuration example of a simple battery pack.

Figure 1A:
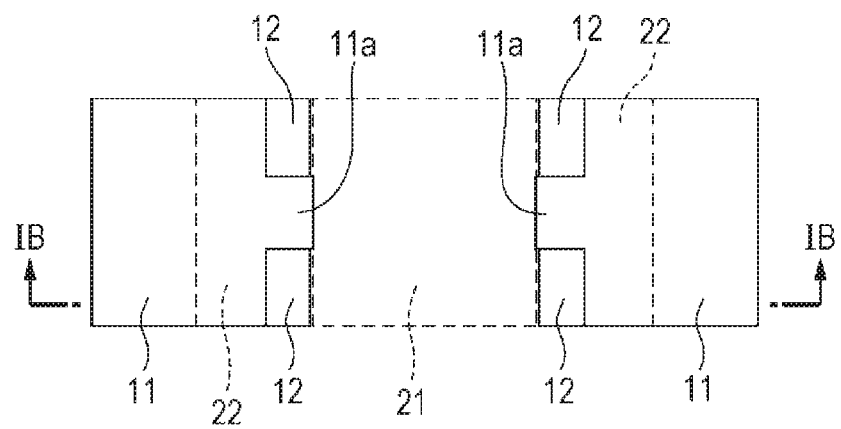
FIG. 1A is a schematic plan view showing the configuration example according to a first embodiment of the present technology.

DESCRIPTION OF EMBODIMENTS (Outline of Present Technology)

First, for better understanding of the present technology, the outline of the present technology will be described. A problem occurring in the solder bonding when the electronic component is mounted is described in PTL 1 (Japanese Unexamined Patent Application Publication No. 2003-318332) described above. For example, problems occurring in the solder bonding when the electronic component is mounted on a substrate are as follows.

After solder is printed on lands of a mounting circuit board, when the electronic component is mounted, the electronic component is bonded through the solder by, for example, applying solder paste through printing, mounting the electronic component, and then heating the solder in a reflow furnace.

The solder bonding through heating and melting is performed in such a manner that printed solder paste is melted through heating, the molten solder paste spreads to the lands and the electrodes of the electronic component due to wetting and capillary action, and the solder is cooled and solidified. In the solder bonding, when the thickness of the applied solder paste is, for example, 100 micrometers, the thickness is reduced due to the weight of the electronic component and the melting of the solder, and the thickness of solder bonding portions under the electrodes of the electronic component after the heating and melting is about 30 micrometers.

In an electronic circuit board, stress occurs in the solder bonding portions due to a difference between the thermal expansion coefficient of the substrate and the thermal expansion coefficient of the component in an environment under actual usage conditions, and thus, strain occurs. When the strain is accumulated, cracks occur in a boundary surface between the solder bonding portions or in the center of the solder bonding portion, and the cracks progress and cause fractures in the solder bonding portions. As a result, the solder bonding loses electrical conduction, and does not have a bonding function.

In contrast, as a method of avoiding the cracks or fractures in the solder bonding portions, there has been suggested a method in which the thickness of the applied solder paste is increased in order to increase the thickness of the solder bonding portions under the electrodes of the electronic component for the sake of reducing stress and strain due to expansion and contraction.

However, when the thickness of the applied solder paste is increased, the solder is crushed by the pressure of the electronic component being mounted. For this reason, a part of the solder is extruded between the electrodes of the electronic component and the lands under the electrodes to cause a solder ball, or the solder spreads onto the substrate around the lands. When there is too much solder, there is a concern that a circuit pattern may be bridged and short circuiting may occur. The electronic component sinks downward at the time of heating in the reflow furnace, and it is difficult to maintain the thickness of the solder bonding portions under the electrodes of the electronic component.

For these reasons, in the related art, in order to prevent the cracks or the fractures in the solder which arise from the stress and the strain due to the expansion and the contraction, it is difficult for a larger amount of solder to stay under the lands and the electrodes of the electronic component. As a result, it is difficult to prevent cracks or fractures due to change over the years or a usage condition of repeated heating and cooling.

Hereinafter, embodiments of the present technology will be described with reference to the drawings. The description will be performed in the following order. Throughout the drawings of the embodiments, the same or corresponding components will be assigned the same reference numerals.

1. First Embodiment (Example of Circuit Board)
2. Second Embodiment (Example of Circuit Board)
3. Third Embodiment (Example of Circuit Board)
4. Another Embodiment (Modification Example)
5. Application Example The respective embodiments described herein are preferred specific examples of the present technology, and the content of the present technology is not limited to these embodiments. The effects described in the present specification are only examples, and are not limited. It is to be noted that there are effects which are different from the illustrated effects.

1. First Embodiment

<Configuration Example of Circuit Board>

A configuration example of a circuit board according to a first embodiment of the present technology will be described. The circuit board is configured by mounting electronic components such as ICs on a substrate including a printed wiring board. In the present specification, the circuit board refers to a substrate on which the respective components have been mounted, that is, the entire substrate including the mounted components.

Figure 1B:
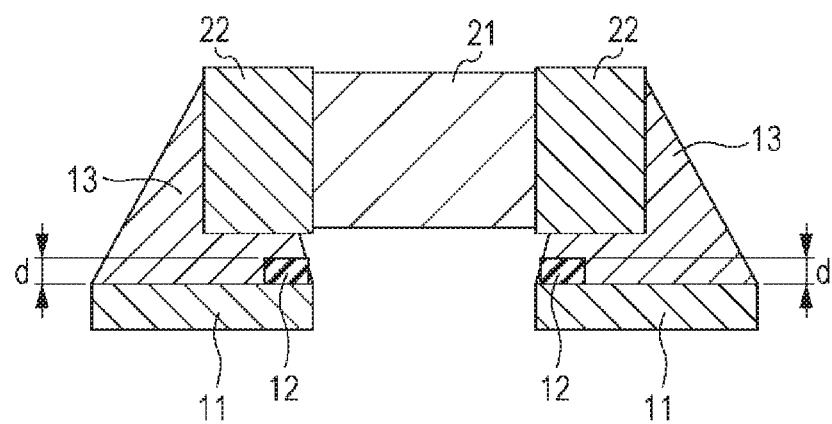
FIG. 1B is a schematic cross-sectional view taken along line IB-IB of FIG. 1A.

FIG. 1A is a schematic plan view showing the configuration example of the circuit board according to the first embodiment of the present technology. FIG. 1B is a schematic cross-sectional view taken along line IB-IB of FIG. 1A. In FIG. 1A and FIG. 1B, members such as a substrate are not illustrated. In FIG. 1A, solder is not illustrated.

As shown in FIG. 1A and FIG. 1B, a pair of lands 11 formed in a conductor pattern such as an island-shaped pattern of a conductor made of a material such as copper foil is formed on a circuit board 1. The pair of lands 11 are provided to be separated from each other, and the lands 11 are respectively bonded to a pair of electrodes 22 that are provided at both ends of an electronic component 21 with solder 13.

Figure 2A:
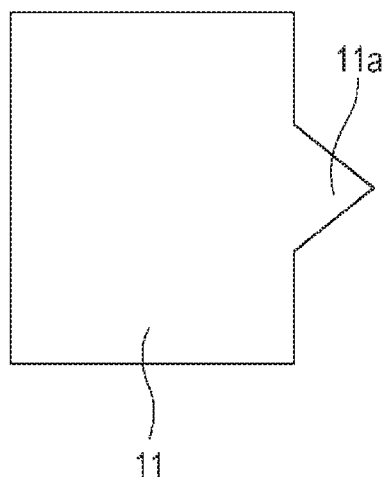
FIG. 2A is a schematic plan view showing a modification example of a shape of a front end of a land.
Figure 2B:
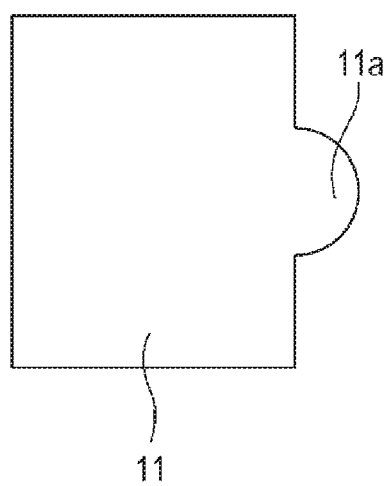
FIG. 2B is a schematic plan view showing a modification example of the shape of the front end of the land.

The lands 11 include front ends 11a on two sides which face each other, respectively. The front end 11a is a portion protruding toward the other facing land 11. The front end 11a has, for example, a rectangular planar shape. The shape of the front end 11a is not limited to the aforementioned shape. For example, the planar shape of the front end 11a may be a triangular shape as shown in FIG. 2A, or may be a polygonal shape such as a triangular shape or a rectangular shape. As shown in FIG. 2B, the planar shape of the front end 11a may be a shape including a curved line such as a semi-circular shape.

Two groups of a pair of insulating protrusions 12 are formed on the circuit board 1 to respectively protrude from surfaces of the lands 11 in a normal direction. The pair of insulating protrusions 12 are formed within an overlapped region with the electrode 22 in the normal direction of the surface of the land 11, and is formed to be separated with at least a part of the front end 11a of the land 11 interposed therebetween.

The insulating protrusions 12 are arranged in four corners under the pair of electrodes 22. That is, one insulating protrusion 12 of the one pair of insulating protrusions 12 is formed under one end of one electrode 22, and the other insulating protrusion 12 is formed under the other end of the one electrode 22. Similarly, one insulating protrusion 12 of the other pair of insulating protrusions 12 is formed under one end of the other electrode 22, and the other insulating protrusion 12 is formed under the other end of the other electrode 22. The electronic component 21 can be stably attached to the substrate by supporting the electrodes 22 with the insulating protrusions 12 arranged in the four corners under the pair of electrodes 22 through the solder 13.

The solder 13 is interposed between the insulating protrusions 12 and the electrodes 22, and the insulating protrusions 12 and the electrodes 22 are respectively bonded through the solder 13. A pair of stepped portions occurring due to a difference in height between the insulating protrusions 12 and the surface of the land 11 are formed with the front end 11a interposed therebetween due to the pair of insulating protrusions 12. Thus, after solder melting, the thickness of the solder 13 between a lower surface of the electrode 22 and the land 11 is secured, and thus, it is possible to allow a large amount of solder 13 to stay between the lower surface of the electrode 22 and the land 11. For example, the thickness of the solder 13 interposed between the lower surface of the electrode 22 and the surface of the land 11 may be, for example, 70 micrometers or more, and more preferably, 80 micrometers or more. As a result, it is possible to improve long-term reliability of the solder. The amount of solder crushed due to the weight of the electronic component 21 by forming the insulating protrusions 12 is reduced, and thus, it is possible to prevent the occurrence of a solder ball.

Figure 3A:
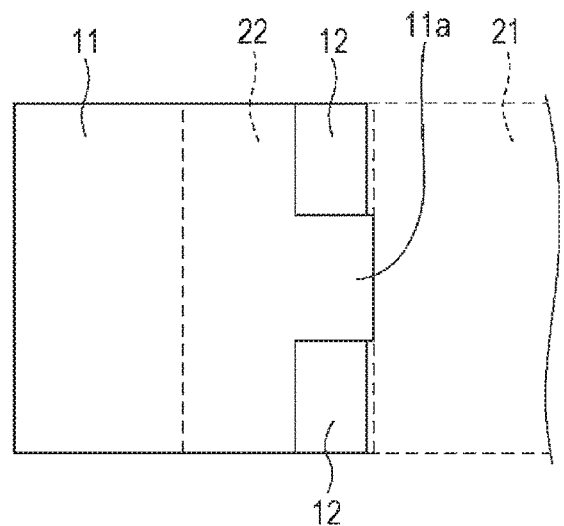
FIG. 3A is a schematic plan view showing a positional relationship between an electrode and the front end of the land.
Figure 3B:
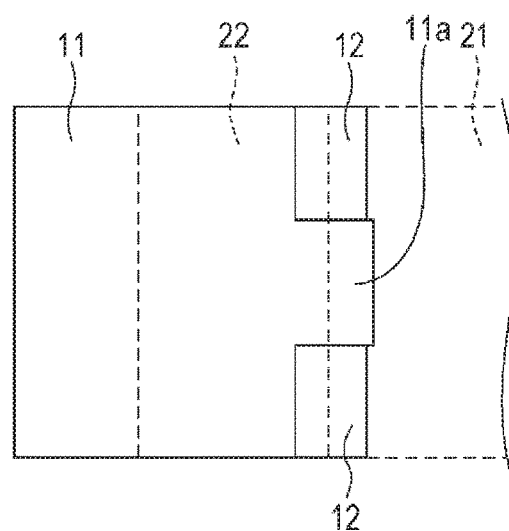
FIG. 3B is a schematic plan view showing a positional relationship between the electrode and the front end of the land.
Figure 3C:
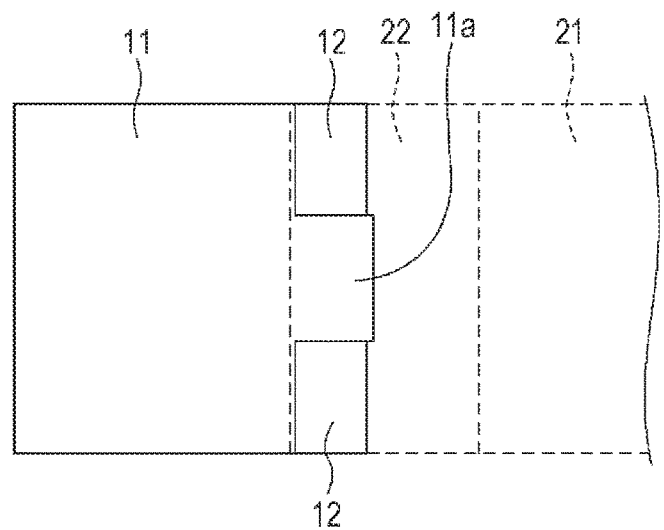
FIG. 3C is a schematic plan view showing a positional relationship between the electrode and the front end of the land.

At least a part of the front end 11a of the land 11 is preferably present within the overlapped region with the electrode 22 in the normal direction of the surface of the land 11. In this case, for example, the entire front end 11a may be present within the overlapped region with the electrode 22 in the normal direction of the surface of the land 11 as shown in FIGS. 3A and 3C, and a part of the front end 11a of the land 11 may be present within the overlapped region with the electrode 22 in the normal direction of the surface of the land 11 as shown in FIG. 3B.

Insulating Protrusion

The insulating protrusion 12 is made of an insulating material. The insulating protrusion 12 may include a single insulating layer, or may include two or more insulating layers made of an insulating material. When the insulating protrusion includes two or more insulating layers, at least two or more layers may be insulating layers made of the same kind of material, or at least two or more layers may be insulating layers made of different kinds of material.

<Thickness of Insulating Protrusion>

A thickness d of the insulating protrusion 12 is preferably 40 micrometers or more as a lower limit, and more preferably, 50 micrometers or more. When an upper limit is defined, the thickness thereof is preferably 100 micrometers or less, and more preferably, 80 micrometers or less. It is assumed that the thickness d of the insulating protrusions 12 falls within the aforementioned range, and thus, it is possible to allow a larger amount of solder to stay between the land 11 and the lower surface of the electrode 22. As a result, it is possible to prevent cracks and fractures in the solder. The thickness d of the insulating protrusion 12 refers to a maximum thickness of the insulating protrusion 12 with the surface of the land 11 as a reference surface.

Specific Configuration Example of Circuit Board

A more specific configuration example of the circuit board 1 will be described. Hereinafter, a first example of the circuit board 1 in which the insulating protrusion 12 includes two insulating layers made of different kinds of material, and a second example of the circuit board 1 in which the insulating protrusion 12 includes a single insulating layer will be described. The configuration of the circuit board 1 is not limited to those described below.

First Example

FIG. 4A is a schematic plan view showing the configuration example of the first example of the circuit board according to the first embodiment of the present technology. FIG. 4B is a schematic cross-sectional view taken along line IVB-IVB of FIG. 4A. FIG. 4C is a schematic cross-sectional view taken along line IVC-IVC of FIG. 4A. In FIG. 4A, solder is not illustrated.

The circuit board 1 includes a substrate 10 that includes a printed wiring board, and the electronic component 21 mounted on the substrate 10. A conductor pattern forming a circuit is formed on the substrate 10, and the pair of lands 11 are formed as the conductor pattern to which the electronic component 21 is bonded. A resist layer 14 is formed on the substrate 10 or on a part of the conductor pattern. A silk layer 15 formed through silk screen printing is formed on the resist layer 14. A portion surrounded by a dotted line in FIGS. 4A to 4C indicates the insulating protrusion 12, and in the first example, the insulating protrusion 12 includes the resist layer 14 and the silk layer 15. The insulating protrusion 12 is present within the overlapped region with the electrode 22 in the normal direction of the surface of the land 11.

As the substrate 10, an insulating substrate such as a paper phenol substrate obtained by immersing phenol resin in paper, a paper epoxy substrate, a glass epoxy substrate, and a glass composite substrate may be used.

Resist Layer

The resist layer 14 is a layer which is formed to cover the conductor pattern formed on the substrate 10 and is made of an insulating material.

Silk Layer

The silk layer 15 is a layer made of an insulating material such as insulating ink. In a process of manufacturing the circuit board 1, characters or numerals called silk indicating, for example, a component name, a component number, and polarity are typically printed through silk screen printing. For example, the silk layer 15 constituting the insulating protrusion 12 may be made of the same insulating material as the silk. In the case of the silk layer 15, the silk layer 15 constituting the insulating protrusion 12 may be formed together with silk in a silk screen printing process for forming silk. The silk layer 15 may be formed as at least a part of the silk.

Thicknesses of Insulating Protrusion, Silk Layer and Resist Layer

As described above, the thickness d of the insulating protrusion 12 constituted by the resist layer 14 and the silk layer 15 is preferably 40 micrometers or more as a lower limit, and more preferably, 50 micrometers or more. When the upper limit is defined, the thickness thereof is 100 micrometers or less, and more preferably, 80 micrometers or less. In general, the thickness of the resist layer 14 is preferably 40 micrometers or more as a lower limit, and when an upper limit is defined, the thickness thereof is preferably 50 micrometers or less. For example, the thickness of the silk layer 15 is preferably 10 micrometers or more as a lower limit. In general, when an upper limit is defined, the thickness thereof is preferably 30 micrometers or less.

Gap Between Silk Layer and Land

The silk layer 15 constituting the insulating protrusion 12 is preferably formed such that a gap between the silk layer and the land 11 ranges from 0.1 mm to 0.3 mm. In the example of FIG. 4A, the gap between the silk layer 15 and the land 11 includes a gap s which has a width in a direction substantially perpendicular to a protruding direction of the front end 11a and a gap t which has a width in the protruding direction of the front end 11a. In the example of FIG. 4A, the gap s and the gap t are preferably from 0.1 mm to 0.3 mm. The lower limit of the aforementioned range is preferably 0.1 mm or more in view of a specification for manufacturing the printed wired board. When the upper limit of the aforementioned range is greater than 0.3 mm, due to deviation tolerance in the manufacturing specification of the printed wiring board, since it is difficult to stably form the silk layer 15 under the electrode 22, the upper limit of thereof is preferably 0.3 mm or less.

Arrangement of Silk Layer Having Rectangular Planar Shape

The silk layer 15 of the example shown in FIGS. 4A to 4C is disposed in a vertical direction such that a longitudinal direction of the silk layer 15 having the rectangular planar shape is substantially perpendicular to the protruding direction of the front end 11a of the land 11. However, the arrangement of the silk layer 15 is not limited to the aforementioned arrangement. For example, as shown in FIG. 5, the silk layer 15 may be disposed in a horizontal direction such that the longitudinal direction of the silk layer 15 having the rectangular planar shape is substantially parallel to the protruding direction of the front end 11a. In the arrangement of the transversal direction, there is concern about influences of the deviation tolerance of the manufacturing specification of the printed wiring board and mounting tolerance of the electronic component. In the normal direction of the surface of the land 11, since the silk layer 15 can be stably arranged within the overlapped range with the electrode 22, the arrangement of the silk layer 15 is preferably the arrangement in the vertical direction shown in FIGS. 4A to 4C.

Second Example

FIG. 6A is a schematic plan view showing the configuration example of the second example of the circuit board according to the first embodiment of the present technology. FIG. 6B is a schematic cross-sectional view taken along line VIB-VIB of FIG. 6A. FIG. 6C is a schematic cross-sectional view taken along line VIC-VIC of FIG. 6A. In FIG. 6A, solder is not illustrated.

Similarly to the first example, the circuit board 1 includes the substrate 10, and the electronic component 21 mounted on the substrate 10. A conductor pattern forming a circuit is formed on the substrate 10, and the pair of lands 11 are formed as a conductor pattern to which the electronic component 21 is bonded. The resist layer 14 is formed on the substrate 10 or on a part of the conductor pattern. A part surrounded by a dotted line in FIGS. 6A to 6C constitutes the insulating protrusion 12, and in the second example, the insulating protrusion 12 includes a single resist layer 14. The insulating protrusion 12 is present within the overlapped region with the electrode 22 in the normal direction of the surface of the land 11. Although not shown, the insulating protrusion 12 may include two or more resist layers 14.

<Thickness of Insulating Protrusion>

As mentioned above, for example, the thickness d of the insulating protrusion 12 constituted by the resist layer 14 is preferably 40 micrometers or more as a lower limit, and more preferably, 50 micrometers or more. When an upper limit is defined, the thickness thereof is 100 micrometers or less, and more preferably, 80 micrometers or less.

<Example of Electronic Component>

FIG. 7 shows the list of sizes of a typical electronic component and the list of dimension values of an electrode of each electronic component. The electrode dimension value (short side a (mm)*long side b (mm)) of the electronic component 21 of the 1608 size in the example shown in FIG. 7 is 0.4 mm*0.8 mm. The electrode dimension value (short side a (mm)*long side b (mm)) of the electronic component 21 of the 2012 size is 0.5 mm*1.25 mm. The electrode dimension value (short side a (mm)*long side b (mm)) of the electronic component 21 of the 3216 size is 0.6 mm*1.6 mm. The electrode dimension value (short side a (mm)*long side b (mm)) of the electronic component 21 of the 3225 size is 0.6 mm*2.5 mm.

As described above, the circuit board 1 according to the first embodiment is preferably applied to the electronic component 21 in which a width a of the short side of the electrode 22 of the 3216 size or the 3225 size is equal to or greater than 0.6 mm.

Figure 8A:
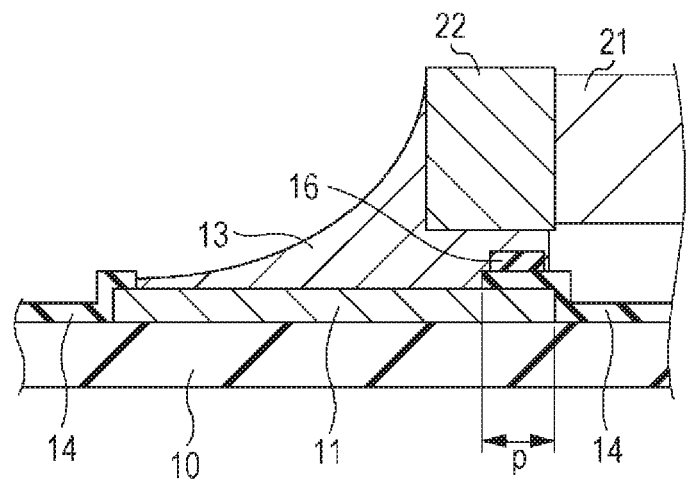
FIG. 8A is a schematic cross-sectional view showing a part of the circuit board.
Figure 8B:
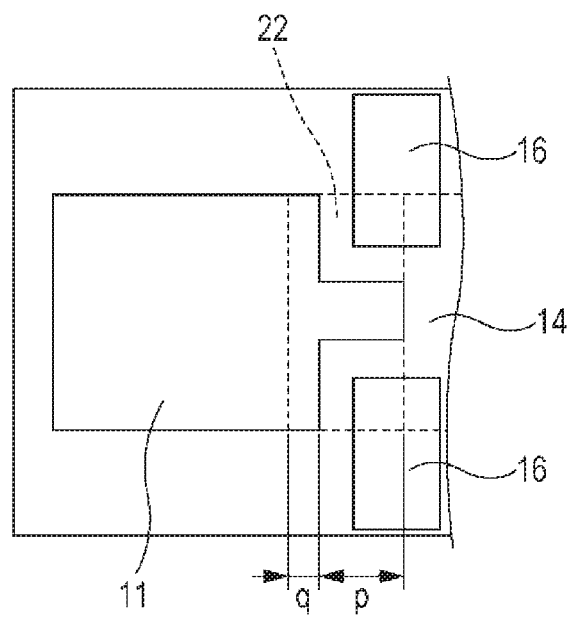
FIG. 8B is a schematic plan view showing a part of the circuit board.

When the lands 11 and the insulating protrusions 12 are formed, a width p of the amount of coated resist on the conductor pattern of the resist layer 14 shown in FIG. 8A is preferably equal to or greater than 0.3 mm in order to further improve bonding strength. When the width p of the amount of coated resist is less than 0.3 mm, since the resist flows, it may be difficult to obtain an appropriate thickness on the conductor pattern. Meanwhile, when the width p of the amount of coated resist is 0.3 mm or more for the electronic component 21 in which a width a of the short side of the electrode 22 of the electronic component 21 of the 1608 size or the 2012 size is less than 0.6 mm, since a width q of the land 11 within the overlapped region with the lower surface of the electrode 22 in the normal direction of the land surface is less than a half of the width a of the short side of electrode 22, the bonding strength of the solder bonding is degraded. Accordingly, the circuit board according to the first embodiment is preferably applied to the electronic component 21 in which the width a of the short side of the electrode 22 of the 3216 size or the 3225 size is equal to or greater than 0.6 mm.

In the first embodiment, when the electronic component 21 in which the width a of the short side of the electrode 22 of the 3216 size or the 3225 size is equal to or greater than 0.6 mm is used, it is possible to allow the thickness of the solder 13 interposed between the lower surface of the electrode 22 and the surface of the land 11 to be greater than the height of the stepped portions occurring due to a difference in height between the insulating protrusion 12 and the surface of the land 11. The height of the stepped portions corresponds to the thickness of the insulating protrusion 12, and, for example, it is possible to allow the thickness of the solder 13 interposed between the lower surface of the electrode 22 and the surface of the land 11 to be equal to or greater than 70 micrometers. The thickness of the solder 13 interposed between the lower surface of the electrode 22 and the surface of the land 11 corresponds to the maximum thickness of the solder 13 present within the overlapped region with the electrode 22 in the normal direction of the surface of the land 11.

2. Second Embodiment

<Configuration Example of Circuit Board>

Figure 9A:
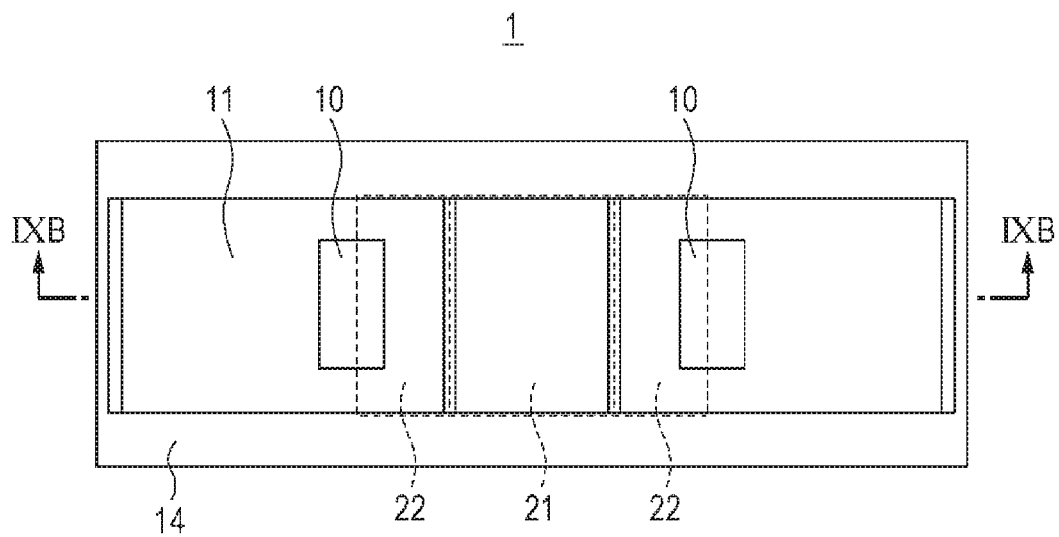
FIG. 9A is a schematic plan view showing a configuration example of a circuit board according to a second embodiment of the present technology.
Figure 9B:
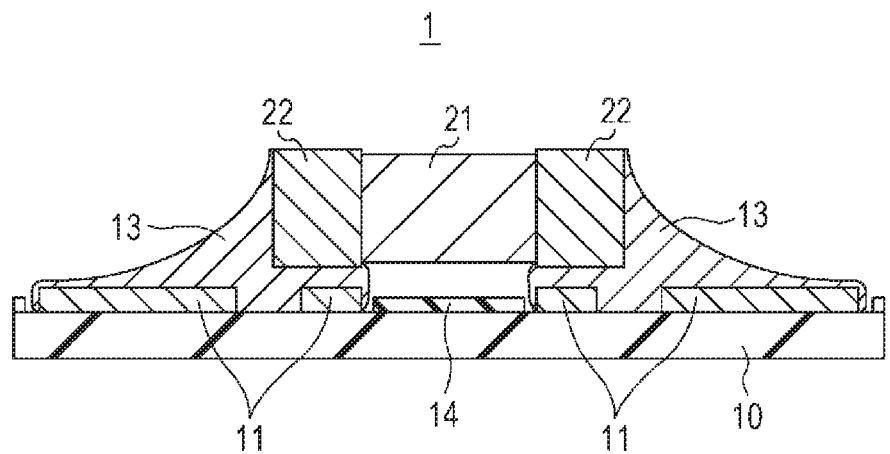
FIG. 9B is a schematic cross-sectional view taken along line IXB-IXB of FIG. 9A.

A configuration example of a circuit board according to a second embodiment of the present technology will be described. FIG. 9A is a schematic plan view showing the configuration example of the circuit board according to the second embodiment of the present technology. FIG. 9 B is a schematic cross-sectional view taken along line VI-VI' of FIG. 9A. In FIG. 9A, the solder is not illustrated.

Similarly to the first embodiment, the circuit board 1 includes a substrate 10, and an electronic component 21 mounted on the substrate 10. A conductor pattern forming a circuit is formed on the substrate 10, and a pair of lands 11 are formed as the conductor pattern to which the electronic component 21 is bonded. The pair of lands 11 are provided to be separated from each other, and the lands 11 are respectively bonded to a pair of electrodes 22 that are provided at both ends of an electronic component 21 with solder 13. A resist layer 14 is formed on the substrate 10.

In the second embodiment, the planar shape of the land 11 has a center-bored shape in which a part of a rectangle is bored in a rectangular shape, and the surface of the substrate 10 is exposed at the center-bored portion. At least a part of the substrate exposing portion at which the surface of the substrate 10 is exposed is included in the overlapped region with the electrode 22 of the electronic component 21 in the normal direction of the land surface. A part of the land 11 surrounding the substrate exposing portion is included in the overlapped region with the electrode 22 of the electronic component 21 in the normal direction of the land surface. Thus, within the overlapped region with the electrode 22 of the electronic component 21 in the normal direction of the land surface, the stepped portions occurring due to the difference in height between the surface of the land 11 surrounding the substrate exposing portion and the substrate exposing portion positioned lower than the surface of the land 11 are formed.

The solder 13 is interposed between the substrate exposing portion and the land 11 and between the substrate exposing portion and electrode 22, and the substrate exposing portion and the land 11, and the substrate exposing portion and electrode 22 are bonded through the solder 13. The solder 13 having a thickness greater than that of the solder between the surface of the land 11 and the lower surface of the electrode 22 is interposed between the lower surface of the electrode 22 and the substrate exposing portion, and the solder thickness between the substrate exposing portion and the lower surface of the electrode 22 which is greater than the solder thickness between the surface of the land 11 and the lower surface of the electrode 22 is obtained. Accordingly, it is possible to further improve the bonding strength of the solder bonding of the electronic component 21. The solder 13 is bonded to the side surface of the land 11 on which the stepped portions are formed, and the bonding area of the solder 13 is increased. Thus, it is possible to further improve the bonding strength of the solder bonding of the electronic component 21.

In the second embodiment, as the solder thickness under the electrode 22, it is possible to allow the thickness between the lower surface of the electrode 22 and the substrate exposing portion to be greater than the height of the stepped portions occurring due to the difference in height between the surface of the land 11 surrounding the substrate exposing portion and the substrate exposing portion positioned lower than the surface of the land 11. For example, when the electronic component 21 of the 1608 size is used, as the solder thickness under the electrode 22, it is possible to allow the thickness between the lower surface of the electrode 22 and the substrate exposing portion to be approximately 38 micrometers (approximately 18 micrometers corresponding to the thickness of the land 11 (thickness of the stepped portion)+approximately 20 micrometers corresponding to the solder thickness between the land surface and the electrode 22), or approximately 55 micrometers (approximately 35 micrometers corresponding to the thickness of the land 11 (thickness of the stepped portion)+approximately 20 micrometers corresponding to the solder thickness between the electrode 22 and the land surface). That is, in the second embodiment, when the electronic component 21 in which the width a of the short side of the electrode 22 of the electronic component 21 of the 1608 size is less than 0.6 mm is used, it is possible to allow the maximum thickness of the solder 13 present within the overlapped region with the electrode 22 in the normal direction of the surface of the land 11 to be equal to or greater than 38 micrometers.

Figure 10A:
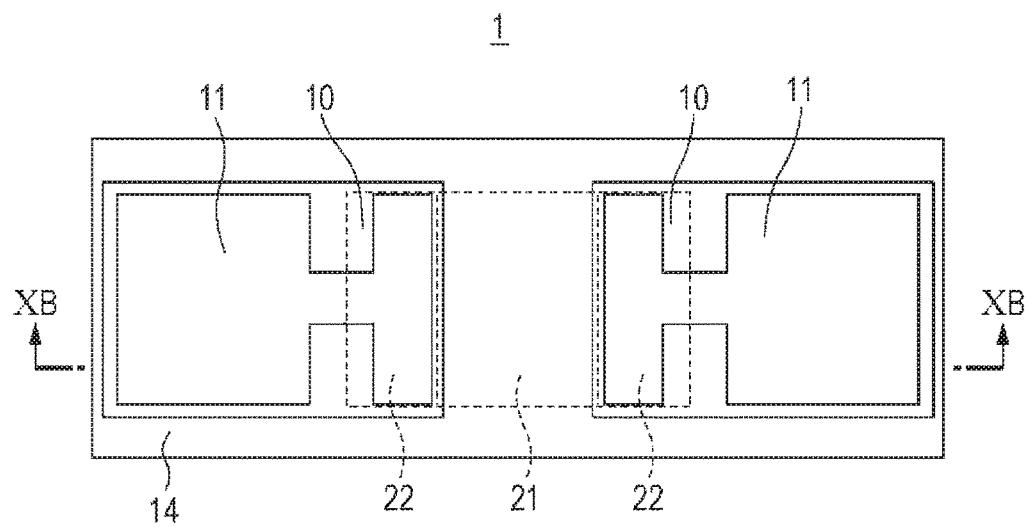
FIG. 10A is a schematic plan view showing the configuration example of the circuit board according to the second embodiment of the present technology.
Figure 10B:
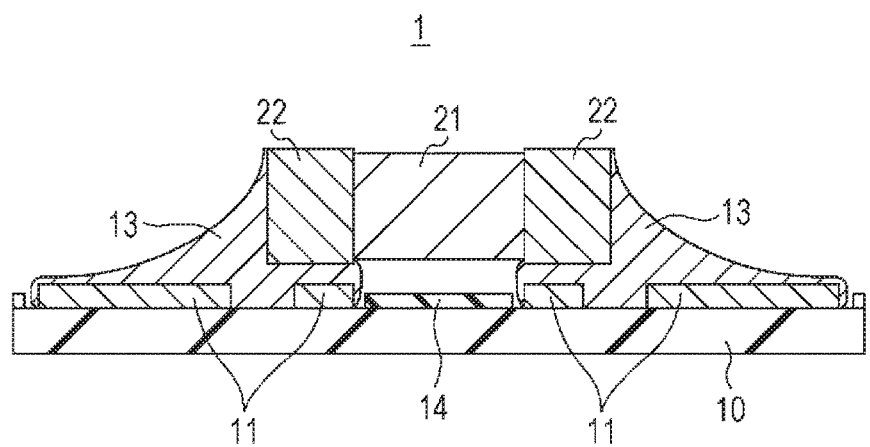
FIG. 10B is a schematic cross-sectional view taken along line XB-XB of FIG. 10A.

As shown in FIGS. 10A and 10B, the planar shape of the land 11 may be a shape in which concave portions are formed on two sides facing each other. In the example shown in FIGS. 10A and 10B, the surface of the substrate 10 is exposed at the concave portions of the land 11. At least a part of the substrate exposing portions and a part of the land 11 sandwiched by the substrate exposing portions are included in the overlapped region with the electrode 22 of the electronic component 21 in the normal direction of the land surface. Thus, within the overlapped region with the electrode 22 of the electronic component 21 in the normal direction of the land surface, stepped portions occurring due to the difference in height between the surface of the land 11 sandwiched by the substrate exposing portions and the substrate exposing portions positioned lower than the surface of the land 11 is formed. The solder 13 is interposed between the substrate exposing portions and the land 11 and between the substrate exposing portions and the electrode 22, and the substrate exposing portions and the land 11, and the substrate exposing portions and the electrode 22 are bonded through the solder 13. The solder 13 having the thickness greater than the solder thickness between the lower surface of the electrode 22 and the surface of the land 11 is interposed between the substrate exposing portions and the lower surface of the electrode 22, and it is possible to allow the solder thickness between the lower surface of the electrode 22 and the substrate exposing portion to be greater than the solder thickness between the surface of the land 11 and the lower surface of the electrode 22. The solder 13 is bonded to the side surface of the land 11 on which the stepped portions are formed, and the bonding area of the solder 13 is increased. Thus, it is possible to further improve the bonding strength of the solder bonding of the electronic component 21.

3. Third Embodiment

Figure 11A:
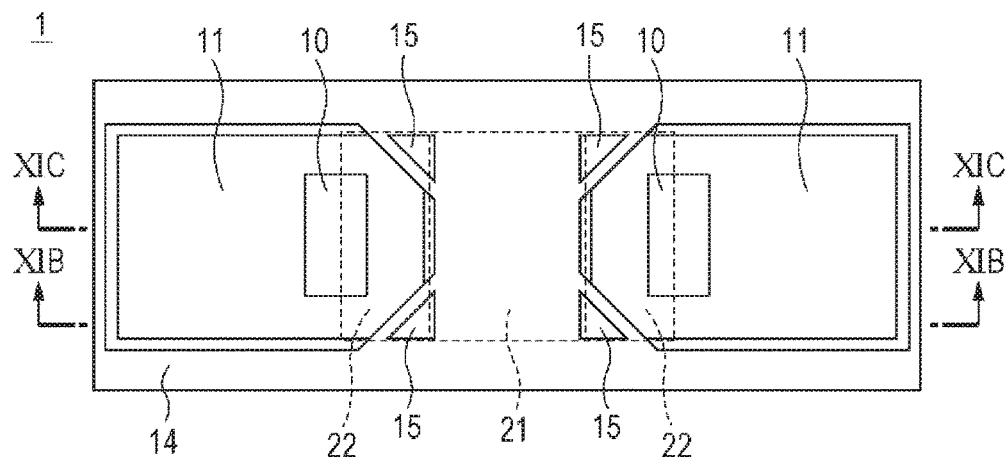
FIG. 11A is a schematic plan view showing a configuration example of a circuit board according to a third embodiment of the present technology.
Figure 11B:
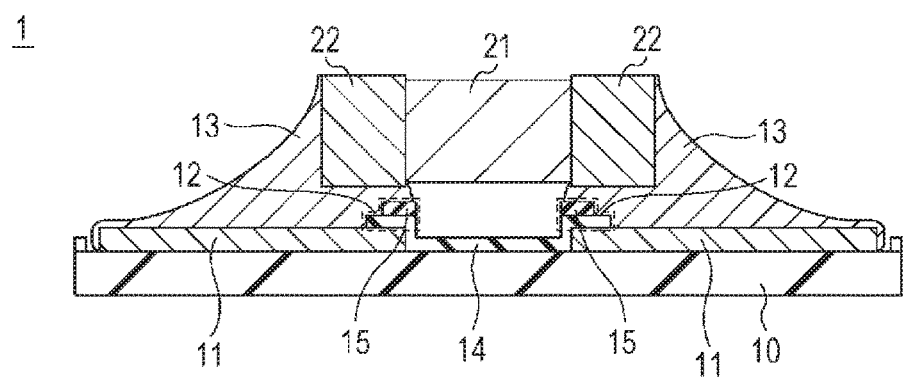
FIG. 11B is a schematic cross-sectional view taken along line XIB-XIB of FIG. 11A.
Figure 11C:
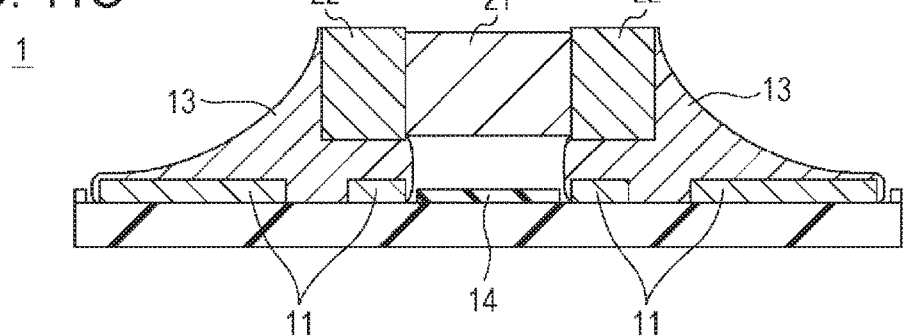
FIG. 11C is a schematic cross-sectional view taken along line XIC-XIC of FIG. 11A.

A configuration example of a circuit board according to a third embodiment of the present technology will be described. FIG. 11A is a schematic plan view showing the configuration example of the circuit board according to the third embodiment of the present technology. FIG. 11B is a schematic cross-sectional view taken along line VII-VII' of FIG. 11A. FIG. 11C is a schematic cross-sectional view taken along line VIII-VIII of FIG. 11A. In FIG. 11A, the solder is not illustrated.

Similarly to the first embodiment, a circuit board 1 includes a substrate 10, and an electronic component 21 mounted on the substrate 10. A conductor pattern forming a circuit is formed on the substrate 10, and a pair of lands 11 are formed as the conductor pattern to which the electronic component 21 is bonded. The pair of lands 11 are provided to be separated from each other, and the lands 11 are respectively bonded to a pair of electrodes 22 that are provided at both ends of an electronic component 21 with solder 13. A resist layer 14 is formed on the substrate 10 or a part of the conductor pattern. A silk layer 15 formed through silk screen printing is formed on the resist layer 14.

In the third embodiment, the planar shape of the land 11 may be a center-bored shape in which a part of a rectangle is bored in a rectangular shape, and may be a shape in which two corners of a rectangle are cut off and the width becomes narrower toward the other facing land 11. The surface of the substrate 10 is exposed at the center-bored portion of the land 11. At least a part of the substrate exposing portion at which the surface of the substrate 10 is exposed is included in the overlapped region with the electrode 22 of the electronic component 21 in the normal direction of the land surface. A part of the land 11 surrounding the substrate exposing portion is included in the overlapped region with the electrode 22 of the electronic component 21 in the normal direction of the land surface. Thus, within the overlapped region with the electrode 22 of the electronic component 21 in the normal direction of the land surface, stepped portions occurring due to the difference in height between the surface of the land 11 surrounding the substrate exposing portion and the substrate exposing portion positioned lower than the surface of the land 11 are formed.

In the third embodiment, two groups of a pair of insulating protrusions 12 are formed to protrude in the normal direction of the surface of the land 11. At least parts of the pair of insulating protrusions 12 are formed within the overlapped region with the electrode 22 in the normal direction of the surface of the land 11, and are formed to be separated from each other so as to sandwich at least a part of a portion in which the width of the land 11 becomes narrow. The portion surrounded by a dotted line of FIGS. 11A to 11C indicates the insulating protrusion 12. In the example shown in FIGS. 11A to 11C, the insulating protrusion 12 includes the resist layer 14 and the silk layer 15.

The insulating protrusions 12 are arranged in four corners under the pair of electrodes 22. That is, one insulating protrusion 12 of one pair of insulating protrusions 12 is formed under one end of one electrode 22, and the other insulating protrusion 12 is formed under the other end of one electrode 22. Similarly, the other insulating protrusion 12 of the other pair of insulation protrusions 12 is formed under one end of the other electrode 22, and the other insulating protrusion 12 is formed under the other end of the other electrode 22. It is possible to stably attach the electronic component 21 to the substrate by supporting the electrode 22 by the insulating protrusions 12 arranged in four corners under the pair of the electrodes 22 through the solder 13.

The solder 13 is interposed between the substrate exposing portion and the land 11 and between the substrate exposing portion and the electrode 22, and the substrate exposing portion and the land 11, and the substrate exposing portion and the electrode 22 are bonded through the solder 13. The solder 13 having the thickness greater than the solder thickness between the surface of the land 11 and the lower surface of the electrode 22 is interposed between the substrate exposing portion and the lower surface of the electrode 22, and the solder thickness between the substrate exposing portion and the lower surface of the electrode 22 which is greater than the solder thickness between the surface of the land 11 and the lower surface of the electrode 22 is obtained. Thus, it is possible to further improve the bonding strength of the solder bonding of the electronic component 21. The solder 13 is bonded to the side surface of the land 11 on which the stepped portions are formed, and it is possible to further improve the bonding strength of the solder bonding of the electronic component 21 by increasing the bonding area of the solder 13.

The solder 13 is also interposed between the insulating protrusion 12 and the electrode 22, and the insulating protrusion 12 and the electrode 22 are bonded through the solder 13. Due to the pair of insulating protrusions 12, a pair of stepped portions occurring due to a difference in height between the insulating protrusions 12 and the surface of the land 11 are formed while sandwiching at least a part of a portion where the width of the land 11 becomes narrow. Thus, the thickness of the solder 13 between the land 11 and the lower surface of the electrode 22 after the solder melting is obtained, and it is possible to allow a large amount of solder 13 to stay between the land 11 and the lower surface of the electrode 22.

In the third embodiment, as the solder thickness under the electrode 22, it is possible to allow the thickness between the lower surface of the electrode 22 and the substrate exposing portion to be greater than the sum of the height of a first stepped portion occurring due to a difference in height between the surface of the land 11 and the substrate exposing portion positioned lower than the surface of the land 11 and the height of a second stepped portion occurring due to a different in height between the surface of the land 11 and the insulating protrusion 12. For example, when the electronic component 21 in which the width of the short side of the electrode 22 of the 2012 size or the 3216 size is equal to or greater than 0.5 mm is used, as the solder thickness under the electrode 22, it is possible to allow the thickness between the substrate exposing portion and the lower surface of the electrode 22 to be approximately 88 micrometers (approximately 18 micrometers corresponding to the thickness of the land 11 (height of the first stepped portion)+approximately 50 micrometers corresponding to the thickness of the insulating protrusion 12 (height of the second stepped portion)+approximately 20 micrometers corresponding to the solder thickness between the electrode 22 and the insulating protrusion 12), or approximately 105 micrometers (approximately 35 micrometers corresponding to the thickness of the land 11 (height of the first stepped portion)+approximately 50 micrometers corresponding to the thickness of the insulating protrusion 12 (height of the second stepped portion)+approximately 20 micrometers corresponding to the solder thickness between the electrode 22 and the insulating protrusion 12). That is, in the third embodiment, when the electronic component 21 in which the width of the short side of the electrode 22 is equal to or greater than 0.5 mm is used, it is possible to allow the maximum thickness of the solder 13 present within the overlapped region with the electrode 22 in the normal direction of the surface of the land 11 to be equal to or greater than, for example, 88 micrometers.

Figure 12A:
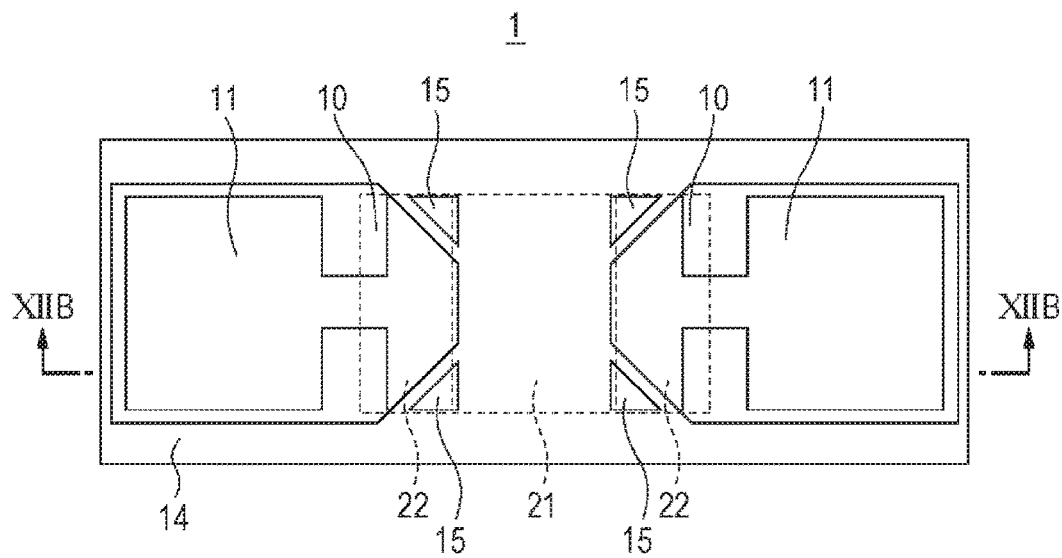
FIG. 12A is a schematic plan view showing the configuration example of the circuit board according to the third embodiment of the present technology.
Figure 12B:
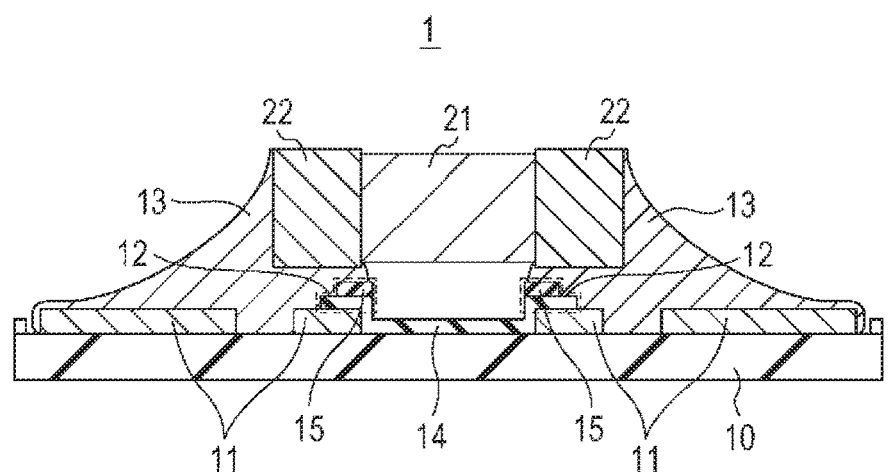
FIG. 12B is a schematic cross-sectional view taken along line XIIB-XIIB of FIG. 12A.

As shown in FIGS. 12A and 12B, the planar shape of the land 11 may be a shape in which concave portions are formed on two sides facing each other, and may be a shape in which two corners of a rectangle are cut off and the width becomes narrower toward the other facing land 11.

In the example shown in FIGS. 12A and 12B, the surface of the substrate 10 is exposed in the concave portions of the land 11. At least a part of the substrate exposing portions and a part of the land 11 sandwiched by the substrate exposing portions are included in the overlapped region with the electrode 22 of the electronic component 21 in the normal direction of the land surface. Thus, stepped portions occurring due to the difference in height between the surface of the land 11 sandwiched by the substrate exposing portions and the substrate exposing portions positioned lower than the surface of the land 11 are formed within the overlapped region with the electrode 22 of the electronic component 21 in the normal direction of the land surface. The solder 13 is interposed between the substrate exposing portions and the land 11 and between the substrate exposing portions and the electrode 22, and the substrate exposing portions and the land 11, and the substrate exposing portions and the electrode 22 are bonded through the solder 13. The solder 13 having a thickness greater than the solder thickness between the surface of the land 11 and the lower surface of the electrode 22 is interposed between the substrate exposing portions and the lower surface of the electrode 22, and the solder thickness between the substrate exposing portions and the lower surface of the electrode 22 which is greater than the solder thickness between the surface of the land 11 and the lower surface of the electrode 22 is obtained. The solder 13 is bonded to the side surface of the land 11 on which the stepped portions are formed, and the bonding area of the solder 13 is increased. Thus, it is possible to further improve the bonding strength of the solder bonding of the electronic component 21. The solder 13 is interposed between the insulating protrusions 12 and the electrode 22, and the insulating protrusions 12 and the electrode 22 are bonded through the solder 13. Due to the pair of insulating protrusions 12, a pair of stepped portions occurring due to the difference in height between the insulating protrusions 12 and the surface of the land 11 are formed while sandwiching at least a part of a portion where the width of the land 11 becomes narrow. Thus, the thickness of the solder 13 between the lower surface of the electrode 22 and the land 11 after the solder melting is obtained, and it is possible to allow a large amount of solder 13 to stay between the lower surface of the electrode 22 and the land 11.

EXAMPLES

Hereinafter, the present technology will be described in detail in conjunction with the examples. The present technology is not limited to the following configurations.

Example 1

A circuit board for a test on which an electronic component (3216 size) has been mounted with the configuration shown in FIGS. 4A to 4C is manufactured. After solder bonding, the maximum thickness of the insulating protrusion (silk layer+resist layer) with the land surface as a reference was measured, and the measured maximum thickness thereof was 80 micrometers. The thickness of the resist layer with the land surface as a reference was 50 micrometers, and the thickness of the silk layer was 30 micrometers.

Comparative Example 1

A circuit board for a test on which an electronic component (3216 size) has been mounted with a configuration in which the insulating protrusion (silk layer+resist layer which constitute the insulating protrusion) is removed from the configuration shown in FIGS. 4A to 4C was manufactured. Temperature Cycle Test A temperature cycle test in which 125 degrees Celsius for 30 minutes to 23 degrees Celsius for 5 minutes to −40 degrees Celsius for 30 minutes to 23 degrees Celsius for 5 minutes were set as one cycle was performed on the manufactured circuit board. The cross section of the solder bonding portion at 750 cycles, 1000 cycles, and 1250 cycles was observed, and it was checked if cracks and fractures had occurred. A case where the cracks and the fractures were not found on the cross section of the solder bonding portion was evaluated as OK, and a case where the cracks or the fractures were found was evaluated as NG.

The evaluated result is represented in Table 1. In Comparative Example 1, since the evaluation at 750 cycles was NG, it is presumed, although not evaluated, that the evaluations at 1000 cycles and 1250 cycles are NG. Thus, in Comparative Example 1, the evaluations at 1000 cycles and 1250 cycles were not performed.

TABLE 1

|  | 750 cycles | 1000 cycles | 1250 cycles |
| --- | --- | --- | --- |
| Example 1 | OK | OK | OK |
| Comparative Example 1 | NG | — | — |

As represented in Table 1, in Example 1, it was seen that it was possible to improve long-term reliability of the solder bonding as compared to Comparative Example 1.

4. Another Embodiment

The present technology is not limited to the above-described embodiment of the present technology, and various modifications and applications are possible within the scope that does not depart from the gist of the present technology.

For example, numerals, structures, shapes, materials, raw materials, and manufacturing processes described in the aforementioned embodiments and examples are only examples, and different numerals, structures, shapes, materials, raw materials and manufacturing processes may be used when necessary.

The configurations, methods, steps, shapes, materials and numerals in the aforementioned embodiments and examples can be combined with each other unless they depart from the gist of the present technology.

For example, the layer constituting the insulating protrusions 12 may be a layer other than the silk layer and the resist layer.

The present technology may have the following configuration.

<1>
An electronic apparatus comprising:
a substrate;
a conductive land formed on a surface of the substrate;
an electronic component including an electrode;
at least one insulating protrusion formed on the land in an overlapping region between the land and the electrode in plan view; and
a solder that bonds the electronic component to the land, the solder being formed between the electrode and the land in the overlapping region in a normal direction to the surface of the substrate.

<2>
The electronic apparatus according to <1>, further comprising a plurality of the protrusions that are positioned in the overlapping region near corners of the electrode in plan view.

<3>
The electronic apparatus according to any one of <1> to <2>, wherein the solder is interposed between the protrusion and the electrode in the normal direction.

<4>
The electronic apparatus according to any one of <1> to <3>, wherein the land includes an extension portion that protrudes from a side of the land in plan view.

<5>
The electronic apparatus according to <4>, wherein a shape of the extension portion is selected from the group consisting of a rectangular shape, a triangular shape, a curved shape and a semicircular shape.

<6>
The electronic apparatus according to <5>, wherein at least a portion of the extension portion is present in the overlapping region.

<7>
The electronic apparatus according to any one of <1> to <6>, wherein a thickness of the solder interposed between the land and the electrode is at least 70 µm in the normal direction.

<8>
The electronic apparatus according to any one of <1> to <7>, wherein a thickness of the protrusion is at least 40 µm in the normal direction.

<9>
The electronic apparatus according to any one of <1> to <8>, wherein when a width of a short side of the electrode is less than 0.5 mm, a maximum thickness of the solder is at least 38 µm, and wherein when a width of a short side of the electrode is greater than 0.5 mm, a maximum thickness of the solder is at least 70 µm.

<10>
The electronic apparatus according to any one of <1> to <9>, wherein the insulating protrusion includes a resist layer formed on the substrate and on the land, and includes an insulating layer formed on the resist layer in the overlapping region.

<11>
The electronic apparatus according to any one of <1> to <10>, wherein a distance between a first side edge of the insulating layer and a corresponding first side edge of the land in a first direction that is perpendicular to the normal direction ranges from 0.1 mm to 0.3 mm, and wherein a distance between a second side edge of the insulating layer and a corresponding second side edge of the land in a second direction that is perpendicular to both the normal direction and the first direction ranges from 0.1 mm to 0.3 mm.

<12>
The circuit board according to <10>, wherein a width of the portion of the resist layer that is formed on the land is at least 0.3 mm.

<13>
An electronic apparatus according to any one of <1> to <12>, wherein the electronic apparatus is a circuit board.

<14>
A battery comprising the electronic apparatus according to any one of <1> to <12>.

<15>
A power storage device comprising the electronic apparatus according to any one of <1> to <12>.

<16>
An electronic device comprising the electronic apparatus according to any one of <1> to <12>.

<17>
An electronic apparatus comprising:
a substrate;
a conductive land formed on a surface of the substrate, the land including a cut out portion that exposes a portion of the underlying substrate;
an electronic component including an electrode; and
a solder that bonds the electronic component to the land, the solder being formed between the electrode and the substrate in the cut out portion of the land in a normal direction to the surface of the substrate,
wherein at least part of the cutout portion is in an overlapping region between the land and the electrode in plan view.

<18>
The electronic apparatus according to <17>, wherein the solder is also interposed between the land and the electrode in the normal direction in the overlapping region.

<19>
The electronic apparatus according to any one of <17> to <18>, wherein the cut out portion includes at least one of an interior portion of the land in plan view, and a recessed portion formed into a side of the land.

<20>
The electronic apparatus according to <19>, wherein the cut out portion includes a plurality of recessed portions formed into opposed sides of the land.

<21>
An electronic apparatus comprising:
a substrate;
a conductive land formed on a surface of the substrate;
an electrode or a terminal electrically connecting an electronic component;
at least one insulating protrusion formed on the land in an overlapping region between the land and the electrode in plan view; and a solder that bonds the electrode or the terminal to the land, the solder being formed therebetween.

<22>

An electronic apparatus comprising:

a substrate;

a conductive land formed on a surface of the substrate, the land including a cut out portion or a dent;

an electrode or a terminal electrically connecting an electronic component; and a solder that bonds the electronic component to the land, the solder being formed therebetween in the cut out portion or the dent of the land in a normal direction to the surface of the substrate.

<23>

There is provided a circuit board including: a substrate; an electronic component that is mounted on the substrate, and includes a pair of electrodes which are formed at both ends; and a pair of lands that are formed on the substrate, face each other, and are respectively bonded to the pair of electrodes through solder. At least any one stepped portion of a first stepped portion between the land and a substrate exposing portion at which the surface of the substrate positioned lower than the land is exposed, and a second stepped portion between the land and an insulating protrusion which is positioned higher than the land is formed within an overlapped region with the electrode in a normal direction of a land surface and protrudes in the normal direction of the land surface, and a maximum thickness of the solder within the overlapped region with the electrode in the normal direction of the land surface is greater than the height of at least any one stepped portion formed within the overlapped region with the electrode in the normal direction of the land surface.

<24>

In the circuit board according to <23>, in the electronic component, a width of a short side of the electrode is less than 0.5 mm, only the first stepped portion may be formed within the overlapped region with the electrode in the normal direction of the land surface, and a maximum thickness of the solder present within the overlapped region with the electrode in the normal direction of the land surface may be equal to or greater than 38 micrometers.

<25>

In the circuit board according to <23>, in the electronic component, a width of a short side of the electrode is equal to or greater than 0.6 mm, only the second stepped portion may be formed within the overlapped region with the electrode in the normal direction of the land surface, and a maximum thickness of the solder present within the overlapped region with the electrode in the normal direction of the land surface may be equal to or greater than 70 micrometers.

<26>

In the circuit board according to <23>, in the electronic component, a width of a short side of the electrode is equal to or greater than 0.5 mm, both of the first stepped portion and the second stepped portion may be formed within the overlapped region with the electrode in the normal direction of the land surface, and a maximum thickness of the solder present within the overlapped region with the electrode in the normal direction of the land surface may be equal to or greater than 88 micrometers.

<27>

There is provided a circuit board including: an electronic component that includes a pair of electrodes which are formed at both ends; a pair of lands that face each other, and are respectively bonded to the pair of electrodes through solder; and two groups of a pair of insulating protrusions that are bonded to the pair of electrodes through solder, and protrude in a normal direction of a land surface. One of the pair of lands protrudes toward the other land from each of two sides facing each other, and has a front end whose part is present within an overlapped region with the electrode in the normal direction of the land surface. The pair of insulating protrusions are separated with at least a part of the front end of the land interposed therebetween, and are present within the overlapped region with the electrode in the normal direction of the land surface.

<28>

In the circuit board according to <27>, a thickness of the insulating protrusion from the land surface may be equal to or greater than 40 micrometers.

<29>

In the circuit board according to <27> or <28>, the insulating protrusion may include a single insulating layer or two or more insulating layers.

<30>

In the circuit board according to <29>, the insulating layer may be at least one of a resist layer and a silk layer.

<31>

In the circuit board according to <30>, the insulating layer may be the resist layer and the silk layer formed on the resist layer, and the silk layer may be disposed in a vertical direction such that a longitudinal direction of a planar shape of the silk layer is substantially perpendicular to a protruding direction of the front end.

<32>

In the circuit board according to <30> or <31>, a gap between the silk layer and the land may be from 0.1 mm to 0.3 mm.

<33>

In the circuit board according to any one of <27> to <32>, the thickness of the solder interposed between the land and a lower surface of the electrode may be equal to or greater than 70 micrometers.

<34>

In the circuit board according to any one of <27> to <33>, the shape of the front end of the land may be a polygonal shape or a shape including a curved line.

<35>

There is provided a circuit board including: a substrate; an electronic component that is mounted on the substrate, and includes a pair of electrodes which are formed at both ends; and a pair of lands that are formed on the substrate, face each other, and are respectively bonded to the pair of electrodes through solder. A part of the land and at least a part of a substrate exposing portion at which the surface of the substrate is exposed are present within an overlapped region with the electrode in a normal direction of a land surface.

<36>

The circuit board according to <25> may further include two groups of a pair of insulating protrusions that are bonded to the pair of electrodes through solder, and are formed to protrude in the normal direction of the land surface. The land may have a shape in which the width becomes narrower toward the other facing land, and the pair of insulating protrusions may be separated so as to sandwich at least a part of a portion where the width of the land becomes narrow, and may be present within the overlapped region with the electrode in the normal direction of the land surface.

<37>

There is provided a power storage device including the circuit board according to any one of <23> to <36>.

<38>

There is provided a battery pack including the circuit board according to any one of <23> to <36>.

<39>

There is provided an electronic device including the circuit board according to any one of <23> to <36>.

5. Application Example

The circuit boards according to the first to third embodiments and another embodiment are built in, for example, an electronic device, a power storage device, a battery pack, and the like.

Power Storage Device

Examples of a power storage device including the circuit board include a power storage device having the configuration shown in FIG. 13. Although not shown, a battery unit and a circuit board on which a control circuit block and the like are mounted are accommodated within an outer case 90 of the power storage device. The circuit board according to the first embodiment or another embodiment of the present technology is applied to this circuit board. Although not shown, the battery unit is a unit in which a member such as a tab that electrically connects a battery block group and a plurality of battery cells is accommodated in a battery case. The battery block group includes, for example, a plurality of battery blocks connected to each other in series, and one battery block includes a plurality of battery cells connected in parallel to each other. The battery cell is, for example, a secondary battery such as a cylindrical lithium-ion secondary battery. The battery cell is not limited to the lithium-ion secondary battery. The battery cell may be a laminated type.

Battery Pack

Examples of a battery pack including the circuit board include a battery pack having the configuration shown in FIG. 14.

This battery pack is a simple battery pack (also referred to as a soft pack). The simple battery pack is built in an electronic device, and is configured in such a manner that a battery cell or a protection circuit is fixed by an insulation tape, a part of the battery cell is exposed, and an output such as a connector connected to a main body of the electronic device is provided.

Figure 15A:
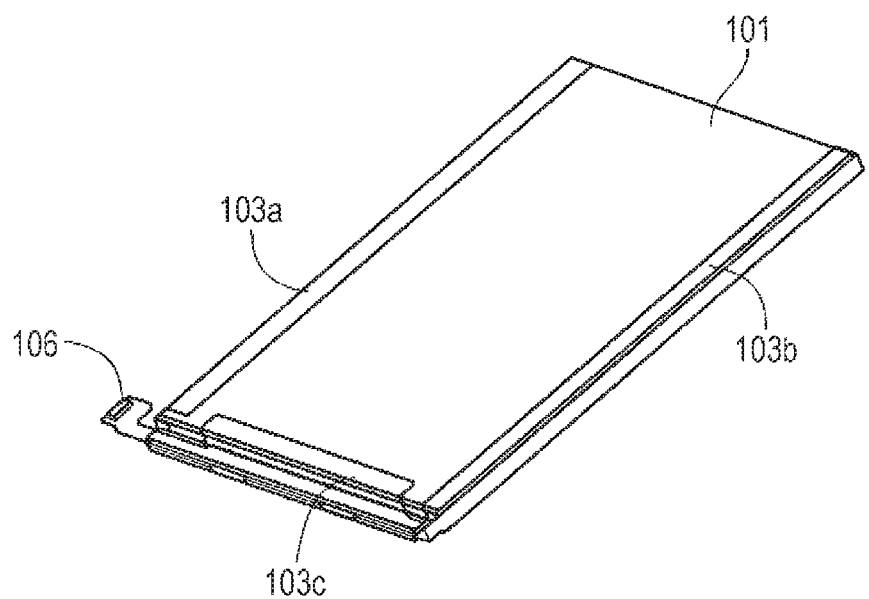
FIG. 15A is a schematic perspective view showing the external appearance of the simple battery pack.

An example of the configuration of the simple battery pack will be described. FIG. 14 is an exploded perspective view showing the configuration example of the simple battery pack. FIG. 15A is a schematic perspective view showing the external appearance of the simple battery pack, and FIG. 15B is a schematic perspective view showing the external appearance of the simple battery pack.

Figure 15B:
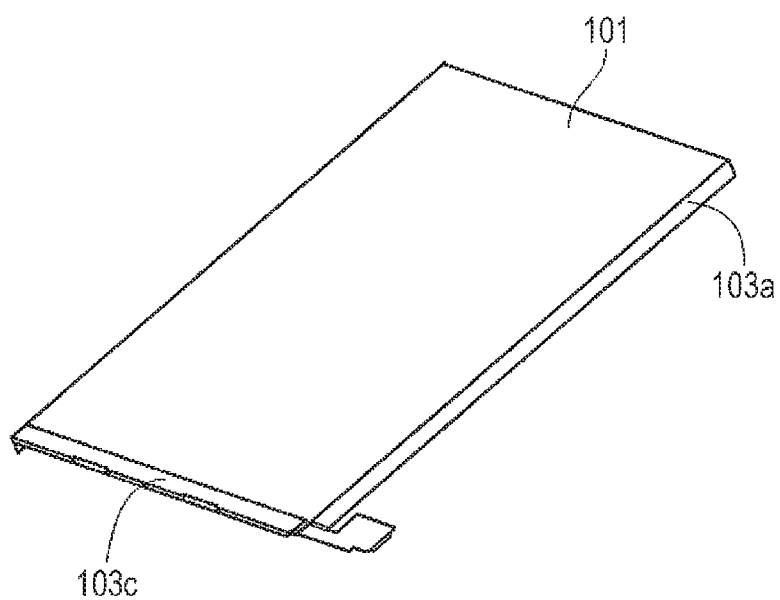
FIG. 15B is a schematic perspective view showing the external appearance of the simple battery pack.

As shown in FIGS. 14, 15A, and 15B, the simple battery pack includes a battery cell 101, leads 102a and 102b extending out of the battery cell 101, insulating tapes 103a to 103c, an insulating plate 104, a circuit board 105 on which a protection circuit module (PCM) is formed, and a connector 106. The circuit board according to the first embodiment or another embodiment is applied to the circuit board 105.

The insulating plate 104 and the circuit board 105 are arranged on a terrace 101a of the front end of the battery cell 101, and the lead 102a and the lead 102b extending out of the battery cell 101 are connected to the circuit board 105.

The connector 106 for output is connected to the circuit board 105. The members such as the battery cell 101, the insulating plate 104 and the circuit board 105 are fixed to predetermined portions of the insulating tapes 103a to 103c.

Electronic Device

Examples of the electronic device including the circuit board include a notebook personal computer, a personal digital assistant (PDA), a cellular phone, a smart phone, a handset for a cordless phone, a projector, a video camera, a digital still camera, an electronic book, an electronic dictionary, a music player, a radio set, a headphone, a game machine, a navigation system, a memory card, a pacemaker, a hearing aid, an electric tool, an electric shaver, a refrigerator, an air-conditioner, a television, a stereo, a water heater, a microwave oven, a dishwashing machine, a laundry machine, a drying machine, lighting equipment, a toy, medical equipment, a robot, a server, a load conditioner, and a traffic light.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

1 Circuit board
10 Substrate
11 Land
11a Front end
12 Insulating protrusion
13 Solder
14 Resist layer
15 Silk layer
21 Electronic component
22 Electrode
90 Outer case
101 Battery cell
101a Terrace section
102a, 102b Lead
103a, 103b, 103c Insulating tape
104 Insulating plate
105 Circuit board
106 Connector

The invention claimed is:

1. An electronic apparatus comprising:
a substrate;
two conductive lands formed on a surface of the substrate that are opposed to one another;
an electronic component including two electrodes, each electrode corresponding to one of the lands;
at least one insulating protrusion formed on each of the lands in an overlapping region between the respective land and the respective electrode in plan view, such that inner portions of the opposed lands are higher than a remaining portion of the lands; and
a solder that bonds the electronic component to the land, the solder being formed between the electrode and the land in the overlapping region in a normal direction to the surface of the substrate,
wherein the insulating protrusions include a resist layer.

2. The electronic apparatus according to claim 1, wherein for each of the electrodes a plurality of the protrusions are positioned in the overlapping region near corners of the electrode in plan view.

3. The electronic apparatus according to claim 2, where the protrusions are the same height.

4. The electronic apparatus according to claim 1, wherein the solder is interposed between the protrusion and the electrode in the normal direction.

5. The electronic apparatus according to claim 1, wherein each of the lands includes an extension portion that protrudes from a side of the land in plan view.

6. The electronic apparatus according to claim 5, wherein a shape of the extension portion is selected from the group consisting of a rectangular shape, a triangular shape, a curved shape and a semicircular shape.

7. The electronic apparatus according to claim 6, wherein at least a portion of the extension portion is present in the overlapping region.

8. The electronic apparatus according to claim 1, wherein a thickness of the solder interposed between the land and the electrode is at least 70 μm in the normal direction.

9. The electronic apparatus according to claim 1, wherein a thickness of the protrusion is at least 40 μm in the normal direction.

10. The electronic apparatus according to claim 1, wherein when a width of a short side of the electrode is less than 0.5 mm, a maximum thickness of the solder is at least 38 μm, and wherein when a width of a short side of the electrode is greater than 0.5 mm, a maximum thickness of the solder is at least 70 μm.

11. The electronic apparatus according to claim 1, wherein a distance between a first side edge of the insulating layer and a corresponding first side edge of the land in a first direction that is perpendicular to the normal direction ranges from 0.1 mm to 0.3 mm, and wherein a distance between a second side edge of the insulating layer and a corresponding second side edge of the land in a second direction that is perpendicular to both the normal direction and the first direction ranges from 0.1 mm to 0.3 mm.

12. The electronic apparatus according to claim 1, wherein a width of the portion of the resist layer that is formed on the land is at least 0.3 mm.

13. An electronic apparatus according to claim 1, wherein the electronic apparatus is a circuit board.

14. A battery comprising the electronic apparatus according to claim 1.

15. A power storage device comprising the electronic apparatus according to claim 1.

16. An electronic device comprising the electronic apparatus according to claim 1.

17. The electronic apparatus according to claim 1, wherein an area of the protrusions in plan view becomes smaller in the normal direction.

18. The electronic apparatus according to claim 1, wherein on inner portions of the lands, there is a protrusion area including the respective protrusions and a non-protrusion area that does not include the respective protrusions.

19. An electronic apparatus comprising:
a substrate;
two conductive lands formed on a surface of the substrate that are opposed to one another;
two electrodes or terminals electrically connecting an electronic component;
at least one insulating protrusion formed on each of the lands in an overlapping region between the respective land and the respective electrode in plan view, such that inner portions of the opposed lands are higher than a remaining portion of the lands; and
a solder that bonds the electrode or the terminal to the land, the solder being formed therebetween,
wherein the insulating protrusions include a resist layer.

20. An electronic apparatus comprising:
a substrate;
two conductive lands formed on a surface of the substrate that are opposed to one another, the lands including a cut out portion or a dent;
two electrodes or terminals electrically connecting an electronic component;
at least one insulating protrusion formed on each of the lands in an overlapping region between the respective land and the respective electrode in plan view, such that inner portions of the opposed lands are higher than a remaining portion of the lands; and
a solder that bonds the electronic component to the land, the solder being formed therebetween in the cut out portion or the dent of the land in a normal direction to the surface of the substrate,
wherein the insulating protrusions include a resist layer.

* * * * *